United States Patent
White

(10) Patent No.: US 6,788,215 B1
(45) Date of Patent: Sep. 7, 2004

(54) ELECTRIC FIELD DETECTOR WITH GPS

(75) Inventor: Isaac D. M. White, Orlando, FL (US)

(73) Assignee: BellSouth Intellectual Property Corporation, Wilmington, DE (US)

( * ) Notice: Subject to any disclaimer, the term of this patent is extended or adjusted under 35 U.S.C. 154(b) by 0 days.

(21) Appl. No.: 10/282,828

(22) Filed: Oct. 29, 2002

(51) Int. Cl.[7] .................................................. G08B 21/00
(52) U.S. Cl. ........................................ 340/657; 340/661
(58) Field of Search ................................ 340/662, 660, 340/657, 661, 658, 659, 663, 664, 573.1; 324/433, 457

(56) References Cited

U.S. PATENT DOCUMENTS

| | | |
|---|---|---|
| 3,309,690 A | 3/1967 | Moffitt |
| 3,546,587 A | 12/1970 | Turecek |
| 3,786,468 A | 1/1974 | Moffitt |
| 3,878,459 A | 4/1975 | Hanna |
| 4,007,418 A | 2/1977 | Hanna |
| 4,714,915 A | 12/1987 | Hascal |
| 4,983,954 A | 1/1991 | Huston |
| 5,635,925 A * | 6/1997 | Kishi et al. .................. 340/996 |
| 5,952,820 A | 9/1999 | Thrasher |
| 6,100,806 A * | 8/2000 | Gaukel ..................... 340/573.4 |
| 6,250,402 B1 * | 6/2001 | Brune et al. ................. 340/657 |
| 6,329,924 B1 | 12/2001 | McNulty |

* cited by examiner

*Primary Examiner*—Anh La
(74) *Attorney, Agent, or Firm*—Walters & Zimmerman; Geoff Sutcliffe; Todd Mitchem

(57) ABSTRACT

Methods and apparatuses are disclosed for sensing an electromagnetic field. A Global Positioning System (GPS) is disposed in a housing, and the GPS acquires global positioning system information describing a location of the apparatus. An electromagnetic sensor is also disposed in the housing and senses the electromagnetic field. An alarm couples to the electromagnetic sensor, the alarm produces an indication of at least one of i) the sensed electromagnetic field and ii) the location of the apparatus.

3 Claims, 5 Drawing Sheets

ELECTRIC FIELD DETECTOR WITH GPS

NOTICE OF COPYRIGHT PROTECTION

A portion of the disclosure of this patent document and its figures contain material subject to copyright protection. The copyright owner has no objection to the facsimile reproduction by anyone of the patent document or the patent disclosure, but the copyright owner otherwise reserves all copyrights whatsoever.

BACKGROUND OF THE INVENTION

1. Field of the Invention

This invention generally relates to electrical communications and, more particularly, to electric field detectors.

2. Description of the Related Art

High-voltages may be lethal when contacted. Electrical transmission lines transmit high voltages. If a person contacts an electrical transmission line, the person could be subjected to a lethal voltage. Telecommunications technicians, cable technicians, construction crews, and other persons are frequently in the vicinity of high voltage power lines, regional power stations, and local substations. These people must take precautions to avoid lethal contact with high voltages.

These persons, then, often use a high-voltage detector. A voltage detector senses an electrical field in the vicinity of the person or in the vicinity of a work area. These voltage detectors warn the person of dangerous, high-voltages in the vicinity. These voltage detectors typically provide an audible and/or visual warning of the dangers voltage. These previous voltage detectors, however, have limited utility. The prior art voltage detectors only sense voltages. Technicians must often carry several pieces of equipment that perform several functions. While the voltage detector is important, life-saving equipment, sometimes a technician cannot carry all the necessary equipment. If the voltage detector could perform multiple functions, the utility of the voltage detector would be improved. There is, accordingly, a need for an improved voltage detector that performs multiple function.

BRIEF SUMMARY OF THE INVENTION

These and other problems are reduced by an enhanced voltage detector. This voltage detector also utilizes a Global Positioning System (GPS) to provide added protection from high voltages. A user wears this voltage detector, and the voltage detector alerts the user when dangerous voltages are present. This voltage detector, however, also alerts the user when entering selected zones or regions that require precautionary measures. The voltage detector receives global positioning system information and determines the present location of the voltage detector. The present location of the voltage detector is then compared to selected global positioning system coordinates stored in memory. When the present location of the voltage detector is within a predefined range of one or more selected coordinates stored in memory, an alarm alerts a user. The user may then take appropriate measures required in the vicinity of the selected global positioning system coordinates.

This invention may alerts the user when safety precautions are required. The selected global positioning system coordinates, for example, may define locations requiring safety clothing, safety procedures, preventative measures, and other precautions. These selected global positioning system coordinates are stored in memory and compared to the user's present location. When the user's present location is within a defined range of the selected global positioning system coordinates, the invention alerts the user. The user may then don safety clothing, implement safety procedures, or implement prescribed measures.

The telecommunications industry provides an example. This invention may alert the user when measures or precautions are required in the vicinity of a telecommunications network. The selected global positioning system coordinates, for example, may define telecommunications network locations. These telecommunications network locations could include the location of a service address, a cross-connect box, a terminal, a hand hole, a pole, a wire center, a central office, or any other network location, network facility, or network component. These selected global positioning system coordinates are stored in memory and then compared to the user's present location. When the user's present location is within a defined range of the selected global positioning system coordinates, the invention alerts the user. When, for example, this invention determines that the user is in the vicinity of a telephone pole, or climbing a telephone pole, the invention alerts the user to don a hard hat. If the invention determines that the user is within a predefined range of a telephone terminal, the invention alerts the user to check for foreign voltages. Whenever the user's present location is within range of a selected location, such as telecommunications network facilities, the voltage detector alerts the user to observe safety precautions.

This invention may also detect dangerous electrical voltages and/or currents. An electromagnetic field sensor may also be housed with the global positioning system. This electromagnetic field sensor is used to determine the presence of voltages and/or currents. When the electromagnetic field sensor detects the presence of harmful or dangerous voltages or currents, this invention also alerts the user. The user may then take appropriate safety precautions.

One aspect of this invention describes an apparatus for sensing electromagnetic fields. This apparatus comprises a Global Positioning System disposed in a housing. The Global Position System acquires global positioning system information describing a location of the apparatus. An electromagnetic sensor is also disposed in the housing, and the electromagnetic sensor senses an electromagnetic field in the vicinity of the apparatus. An alarm couples to the electromagnetic sensor, and the alarm produces an indication of the sensed electromagnetic field. The alarm may also couple to the Global Position System and produce a visual and/or audible indication of the global positioning system information.

Still another aspect of this invention describes a method for alerting a user of global positioning system information. Current global positioning system information is received, and the global positioning system information describes a current location. The current global positioning system information is compared to stored global positioning system information. An alarm is visually and/or audibly activated when the current global positioning system information is within a predefined range of the stored global positioning system information. The method may also sense an electromagnetic field in the vicinity of a location described by the current global positioning system information. The sensed electromagnetic field is compared to a threshold value, and the alarm is activated when the sensed electromagnetic field at least one of i) equals a threshold value or ii) exceeds the threshold value.

BRIEF DESCRIPTION OF THE SEVERAL VIEWS OF THE DRAWINGS

These and other features, aspects, and advantages of this invention are better understood when the following Detailed Description of the Invention is read with reference to the accompanying drawings, wherein.

DETAILED DESCRIPTION OF THE INVENTION

Figure 1:
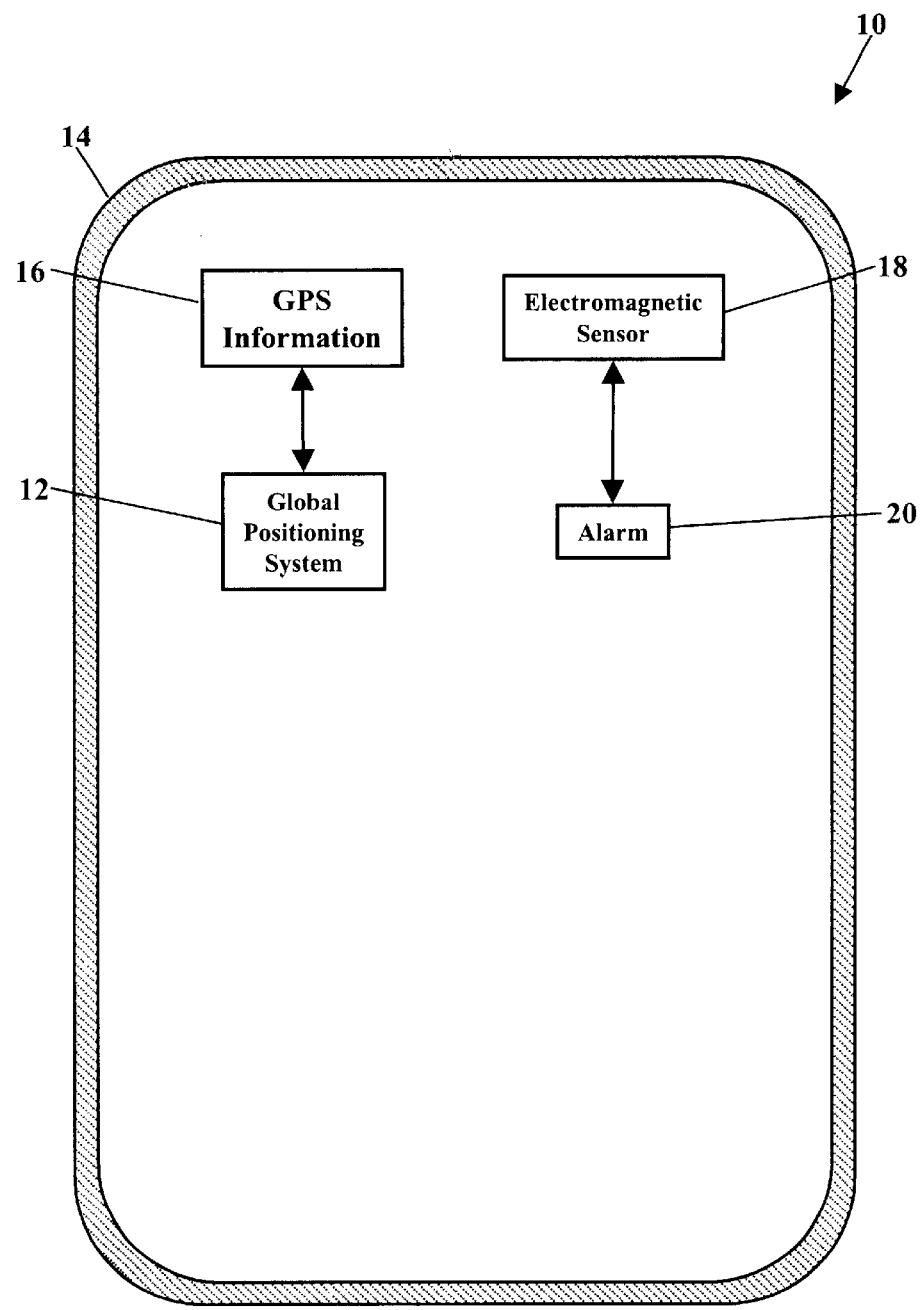
FIG. 1 illustrates one aspect of this invention.

FIG. 1 illustrates one aspect of this invention. FIG. I is a block diagram showing an apparatus 10 for detecting electromagnetic fields. This apparatus 10 comprises a Global Positioning System 12 disposed in a housing 14. The Global Position System 12 acquires global positioning system (GPS) information 16. This GPS information 16 describes the present location of the apparatus 10. The apparatus 10 also comprises an electromagnetic sensor 18 disposed in the housing 14. The electromagnetic sensor 18 senses an electromagnetic field in the vicinity of the apparatus 10. An alarm 20 couples to the electromagnetic sensor 18 and produces an audible and/or visual indication of the sensed electromagnetic field.

When the sensed electromagnetic field is harmful, the alarm 20 preferably produces an audible and/or visual indication. When the sensed electrical voltage and/or current i) equals a threshold value or ii) exceeds the threshold value, the alarm 20 is preferably activated. The user may then take appropriate safety precautions. The threshold may be set to any voltage or current, but the threshold is most commonly set to exclude voltages and currents outside a frequency band of fifty to sixty Hertz (50–60 Hz.). This threshold commonly corresponds to electrical power transmission in the United States. This threshold could also be set to correspond with electrical transmission in other countries, or the threshold could be set to correspond with any desired voltage or current. The threshold value may be implemented using any circuit design, but the circuit design preferably uses a bandpass filter. If the apparatus is used to detect electrical power transmission in the United States, the bandpass filter is chosen to exclude voltages and currents outside the frequency band of fifty to sixty Hertz (50–60 Hz.). The bandpass filter, however, correspond with any desired voltage or current.

Figure 2:
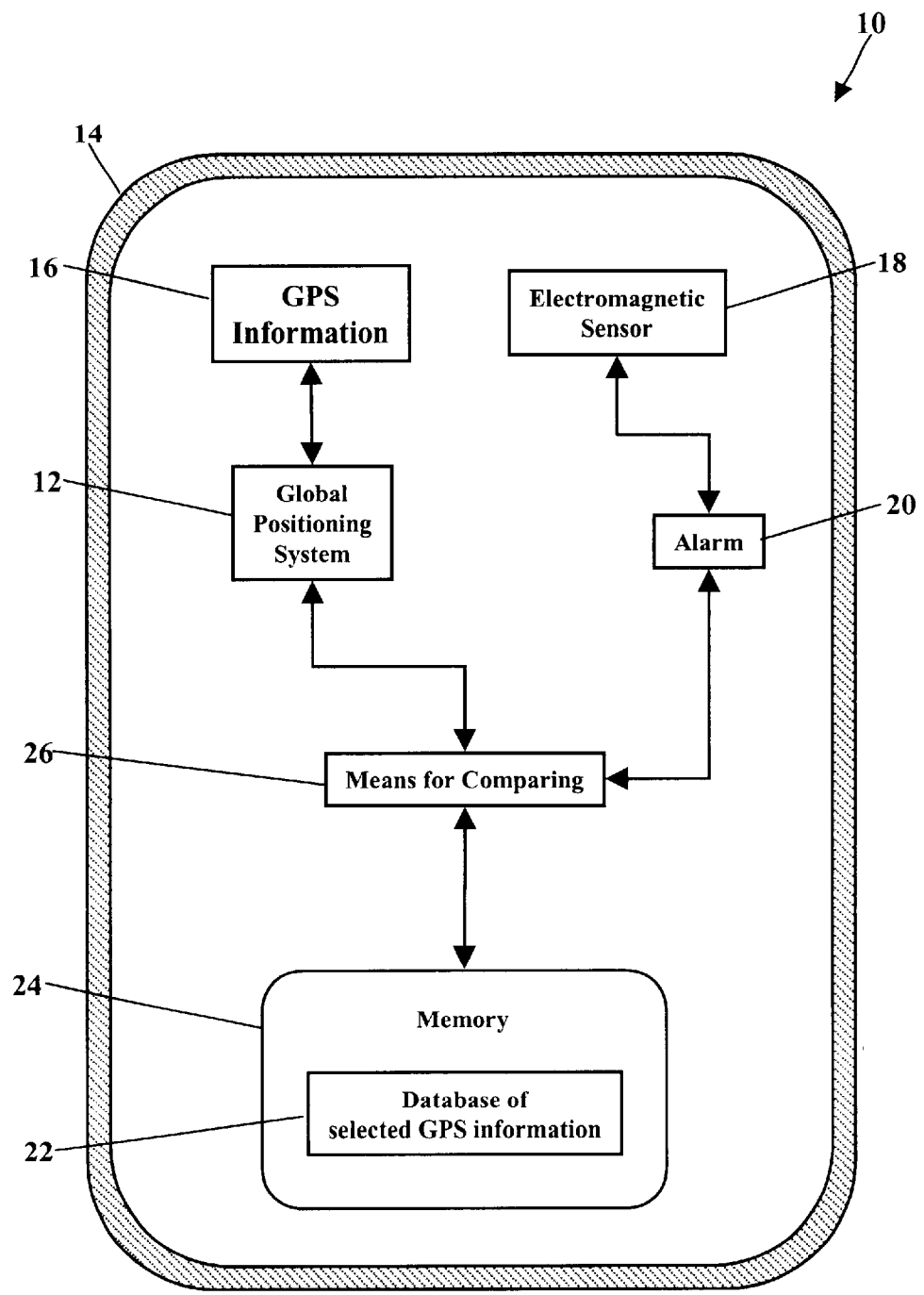
FIG. 2 illustrates another aspect of this invention.

FIG. 2 illustrates another aspect of this invention. FIG. 2 is a block diagram showing the apparatus 10 for detecting electromagnetic fields. FIG. 2, however, shows the apparatus 10 may also comprise a database 22 of selected global positioning system (GPS) information. The database 22 is stored in a memory device 24. The apparatus 10 also includes means for comparing 26 the GPS information 16 of the apparatus with the selected GPS information in the database 22. The alarm 20 couples to the means for comparing 26, and the alarm 20 produces an audible and/or visual indication when the GPS information 16 of the apparatus is within a predefined range of the selected GPS information in the database 22. When, therefore, the current location of the apparatus 10 matches, or is within a predefined range of, the selected GPS information in the database 22, the alarm 20 is activated.

The apparatus 10 of FIG. 2 alerts the user when entering selected zones or regions. When the present location of the apparatus 10, as defined by the GPS information 16, is within a predefined range of the selected GPS information stored in the database 22, the alarm 20 is activated. The alarm 20 alerts the user, and the user may then take appropriate measures required in the vicinity of the selected GPS information stored in the database 22. The selected GPS information (stored in the database 22), for example, may define locations requiring safety clothing, safety procedures, preventative measures, and other precautions. These selected GPS coordinates are stored in memory 24 and compared to the user's present location. When the user's present location is within a defined range of the selected GPS coordinates, the invention alerts the user. The user may then don safety clothing, implement safety procedures, or implement prescribed measures.

Figure 3:
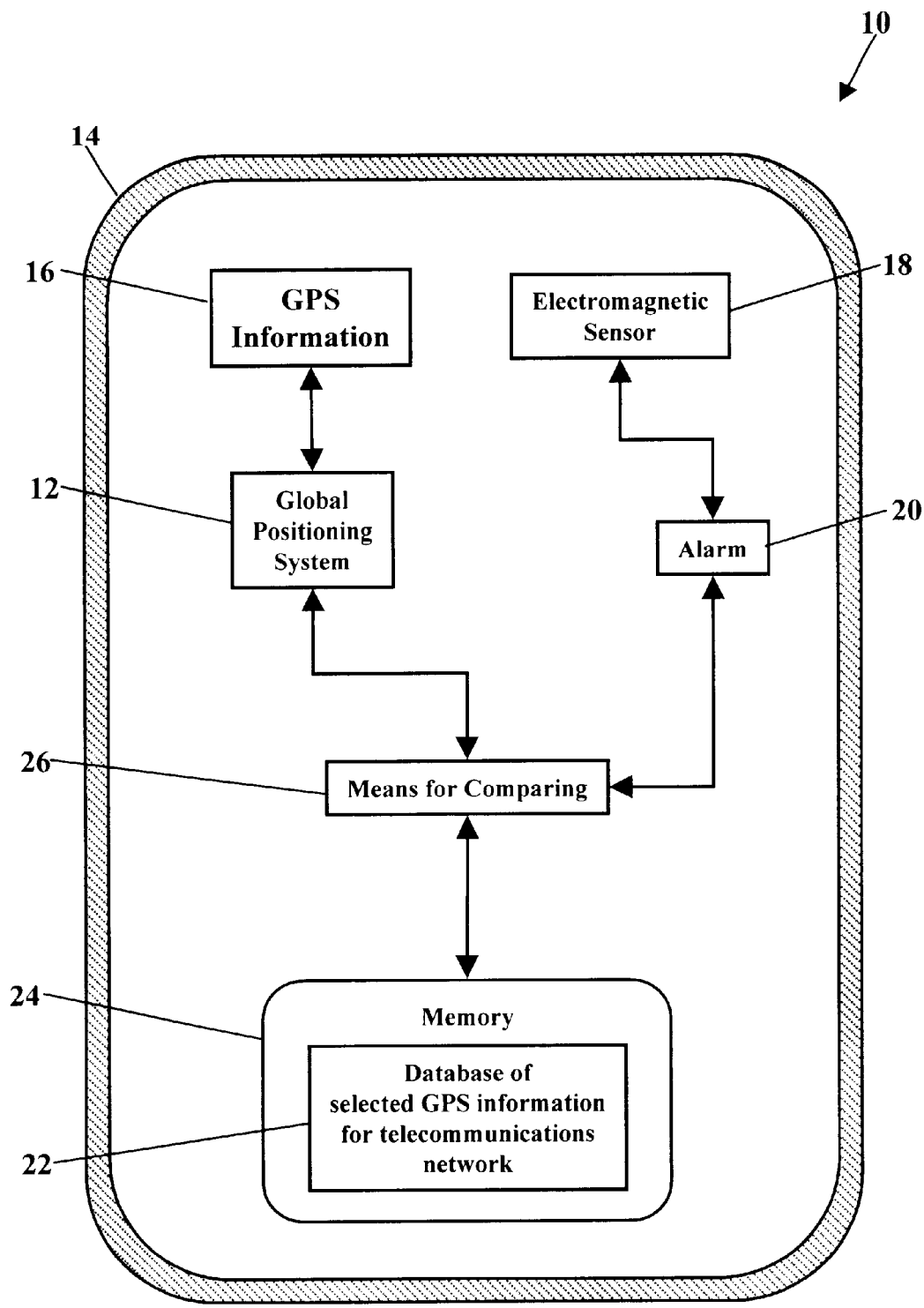
FIG. 3 illustrates still another aspect of this invention.

FIG. 3 illustrates still another aspect of this invention. FIG. 3 is a block diagram showing the apparatus 10 for detecting electromagnetic fields in the vicinity of telecommunications network equipment. As FIG. 3 shows, the selected GPS information (stored in the database 22) may define location of telecommunications network equipment. The database 22, for example, could store the location of a customer's service address, a cross-connect box, a terminal, a hand hole, a pole, a wire center, a central office, or any other telecommunications network location, network facility, or network component. These telecommunications locations are defined by the database 22 of selected GPS information. These telecommunications locations are stored in the memory 24 and then compared to the present location of the apparatus 10. When the present location of the apparatus 10 is within a predefined defined range of the selected GPS information, the alarm 20 alerts the user. When, for example, a telecommunications technician wears the apparatus 10 and begins to climb a telephone/utility pole, the apparatus 10 alerts the technician to don a hard hat. If the telecommunications technician is within a predefined range of a telephone terminal, the apparatus 10 alerts the technician to check for foreign, high voltages that may be present in the terminal wiring. Whenever the user's present location is within a defined range of the selected telecommunications network coordinates (stored in the database 22), the invention alerts the user. The user may then don safety clothing, implement safety procedures, or implement prescribed measures required in the vicinity of the telecommunications network location.

The GPS information (such as reference numeral 16 or that stored in the database 22) describes a location. The GPS information is preferably latitude, longitude, and elevation. The GPS information could alternatively be expressed in any x, y, and z coordinate value. These alternative x, y, and z coordinates could be expressed in U.S. Customary and British Imperial units, such as feet and miles, or in metric units, such as meters and kilometers. The global positioning system information could also be expressed as position, velocity, and time coordinates; however, latitude, longitude, and elevation are more readily understood. Because the principals of satellite-based navigation are well understood, the Global Positioning System 12 will not be further discussed. If the reader desires a more detailed explanation of the Global Positioning System 12, the National Aeronautical and Space Administration (NASA) offers several tutorials and background papers. See http://leonardo.jpl.nasa.gov/msl/Programs/gps.html.

The means for comparing 26 may be any circuitry. The means for comparing 26 may be any circuit design that compares information, voltages, currents, or charges. The means for comparing 26, for example, may be comparator, a combination of logic gates, or preferably a processor. The means for comparing 26 receives the present location of the apparatus from the Global Positioning System 12. The means for comparing 26 then compares the present location of the apparatus 10 to the selected GPS information stored in the database 22. When the present location of the apparatus 10 is within a predefined defined range of the selected GPS information, the alarm 20 alerts the user.

The predefined range may be any distance. The predefined range may be any distance, from millimeters to kilometers or from inches to miles. The predefined range may be set by the user, established by a supervisor, or prescribed by some authority. The predefined range, for example, may be input by the user or some other person using a data entry device for the apparatus 10 (such as a keypad, range selector, or data link to a computer or to a computer network). The predefined range, however, is most preferably stored in the memory 24. Each entry of the selected GPS information (stored in the database 22) may also include a corresponding predefined range. As the present location of the apparatus 10 changes, the means for comparing 26 then compares that present location to 1) the selected GPS information stored in the database 22 and to 2) the corresponding predefined range. When the current location of the apparatus 10 is within the predefined defined range of selected GPS information stored in the database 22, the alarm 20 is activated.

The activated alarm 20 may also have a timer. When the alarm 20 is activated, a timer may also be activated. If the user does not deactivate the alarm 20 within a predetermined time frame, the apparatus 20 may initiate communication with a supervisor, safety personnel, or other entity. If, for example, the apparatus 10 detects a dangerous voltage near a telecommunications terminal, the alarm 20 is activated. A thirty-second (30 sec.) timer is also activated. If the alarm 20 is not turned off, or otherwise deactivated, the apparatus initiates communication. This communication could wireless or wired communication. The apparatus 10, for example, could interface with a mobile communications device. The mobile communications device could also be housed within the housing 14, or the apparatus 10 could wirelessly activate the mobile communications device. The mobile communications device could be a cellular phone, a wireless pager, a radio, or any other communications device.

Figure 4:
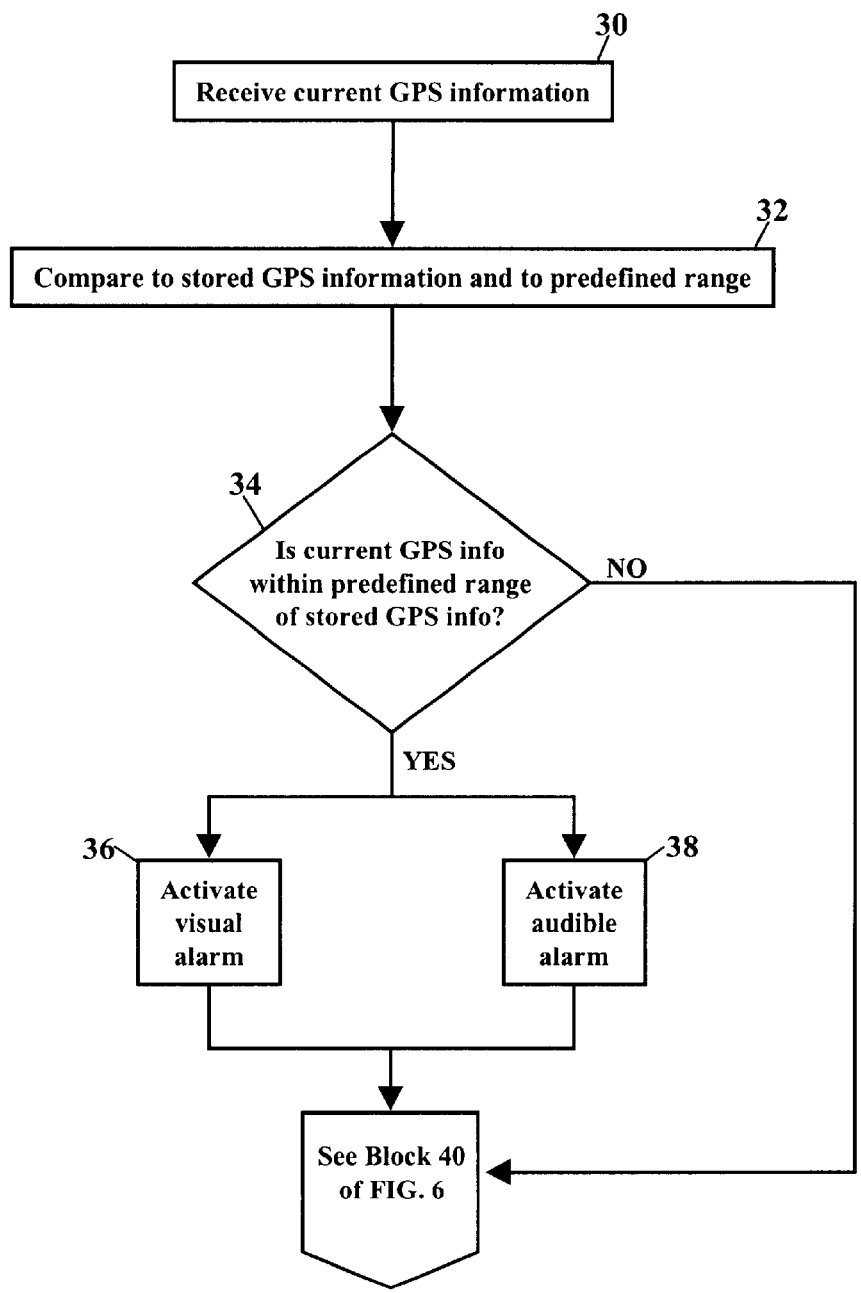
FIGS. 4 and 5 are flowcharts showing another aspect of this invention.
Figure 5:
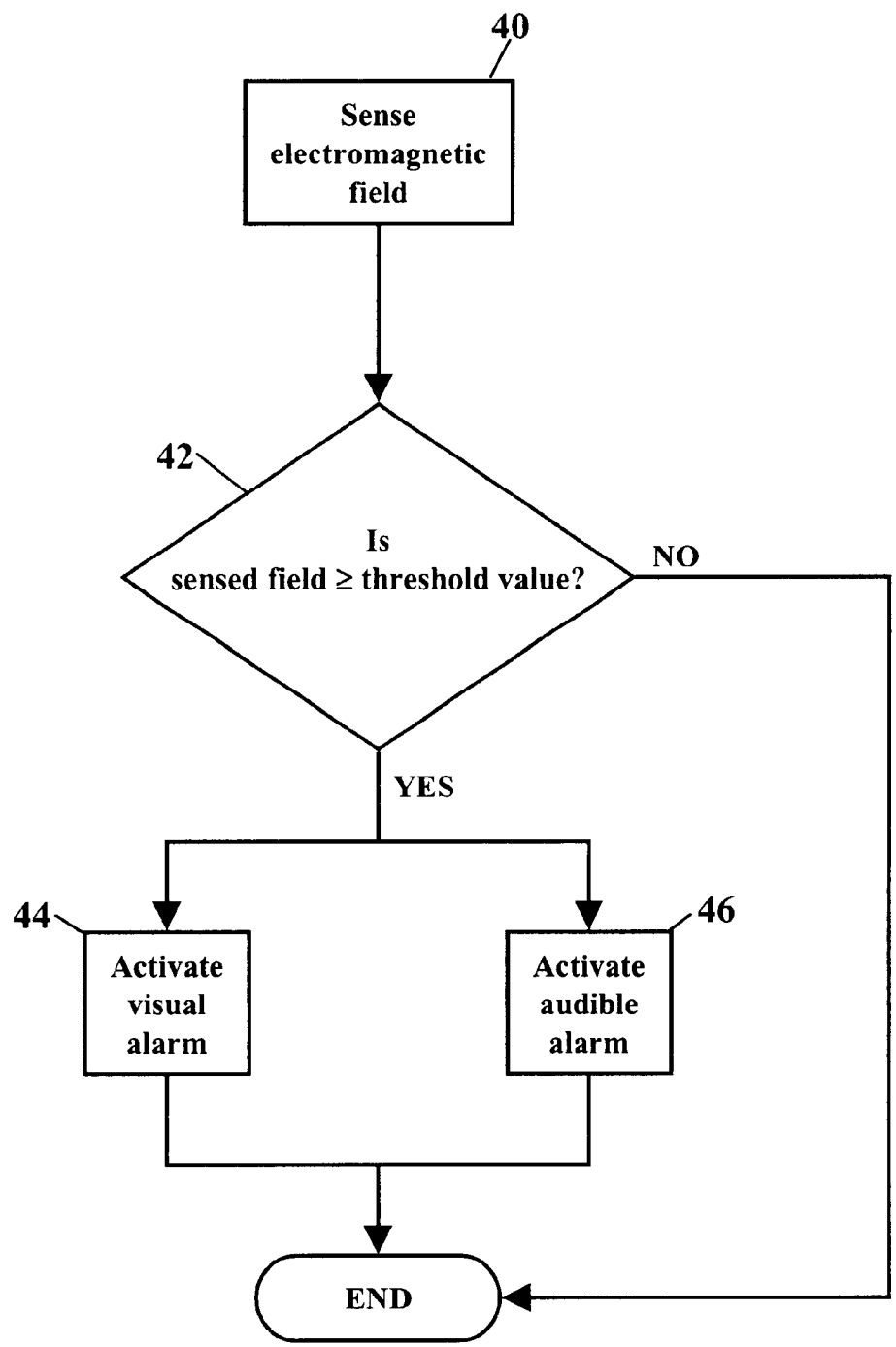

FIGS. 4 and 5 are flowcharts showing one method of receiving Global Positioning system coordinates. Current global positioning system (GPS) information is received (Block 30). The global positioning system information describes a current location. The current global positioning system information is compared to stored global positioning system information (Block 32) and compared to a predefined range (Block 32). If the current global positioning system information is within the predefined range of the stored global positioning system information (Block 34), a visual alarm (Block 36) and/or an audible alarm (Block 38) is activated.

The flowchart continues with FIG. 5. An electromagnetic field may also be sensed (Block 40). This electromagnetic field is preferably in the vicinity of the location described by the current global positioning system information may also be sensed (Block 42). If the sensed electromagnetic field equals and/or exceeds a threshold value (Block 44), the visual alarm (Block 46) or the audible alarm (Block 48) is activated.

While the present invention has been described with respect to various features, aspects, and embodiments, those skilled and unskilled in the art will recognize the invention is not so limited. Other variations, modifications, and alternative embodiments may be made without departing from the spirit and scope of the present invention.

What is claimed is:

1. An apparatus comprising:

a housing;

a Global Positioning System disposed in the housing, the Global Position System acquiring global positioning system information, the global positioning system information describing a location of the apparatus;

a database of global positioning system information for a telecommunications network, the database stored in a memory of the apparatus, the database of global positioning system information describing at least one of a cross-connect box, a terminal, a hand hole, a pole, a wire center, and a central office;

an electromagnetic sensor disposed in the housing, the electromagnetic sensor sensing an electromagnetic field;

means for comparing the global positioning system information of the apparatus with the global positioning system information for the telecommunications network;

an alarm coupled to the electromagnetic sensor and to the means for comparing, the alarm producing an indication of the sensed electromagnetic field, and when the global positioning system information of the apparatus matches the global positioning system information for the telecommunications network.

2. An apparatus according to claim 1 wherein the alarm couples to the means for comparing, and the alarm produces the indication when the global positioning system information of the apparatus is within a predefined range of the global positioning system information for the telecommunications network.

3. A method, comprising:

receiving current global positioning system information, the global positioning system information describing a current location;

comparing the current global positioning system information to stored global positioning system information;

sensing an electromagnetic field in the vicinity of the current location;

activating an alarm when the current global positioning system information is within a predefined range of the stored global positioning system information; and when the sensed electromagnetic field at least one of i) equals a threshold value and ii) exceeds the threshold value.

* * * * *